United States Patent
Lee et al.

(10) Patent No.: US 9,651,597 B1
(45) Date of Patent: May 16, 2017

(54) SYSTEMS AND METHODS FOR MONITORING CAPACITOR BANKS

(71) Applicant: General Electric Company, Schenectady, NY (US)

(72) Inventors: Yongjae Lee, Latham, NY (US); Selaka Bandara Bulumulla, Niskayuna, NY (US); Daniel Qi Tan, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 15/189,982

(22) Filed: Jun. 22, 2016

(51) Int. Cl.
| G08B 23/00 | (2006.01) |
| G01R 27/26 | (2006.01) |
| H02J 3/16 | (2006.01) |
| H02J 50/12 | (2016.01) |
| G06K 7/10 | (2006.01) |

(52) U.S. Cl.
CPC ..... *G01R 27/2605* (2013.01); *G06K 7/10366* (2013.01); *H02J 3/16* (2013.01); *H02J 50/12* (2016.02)

(58) Field of Classification Search
CPC ........ G01R 27/2605; H02J 50/12; H02J 3/16; G06K 7/10366
USPC .......................................... 340/657; 324/430
See application file for complete search history.

(56) References Cited

U.S. PATENT DOCUMENTS

| 5,966,008 A * | 10/1999 | Maier .................. G01R 15/183 324/117 R |
| 8,466,689 B2 | 6/2013 | Younsi et al. |
| 8,575,941 B2 | 11/2013 | Samineni et al. |
| 8,912,801 B2 | 12/2014 | Gajic et al. |
| 2009/0231764 A1 | 9/2009 | Banting et al. |
| 2010/0073528 A1* | 3/2010 | Lee ........................ H04N 5/365 348/255 |
| 2010/0245057 A1* | 9/2010 | Chamarti ............... G01D 21/00 340/10.42 |

(Continued)

FOREIGN PATENT DOCUMENTS

| CN | 104111392 A | 10/2014 |
| CN | 104298222 A | 1/2015 |
| CN | 204389611 U | 6/2015 |

OTHER PUBLICATIONS

Yifeng, Guo; "Analysis and Design of the Super Capacitor Monitoring System of Hybrid Electric Vehicles", Procedia Engineering, vol. 15, pp. 90-94, 2011.

(Continued)

*Primary Examiner* — Ojiako Nwugo
(74) *Attorney, Agent, or Firm* — Nitin N. Joshi

(57) ABSTRACT

A system includes a capacitor unit having one or more capacitors within a body of the capacitor unit, wherein the capacitor unit comprises at least two bushings. The system includes a monitoring system having a first antenna. The monitoring system is configured to couple to the at least two bushings to form a resonant frequency (LC) circuit having a capacitance based at least in part on an effective capacitance of the capacitor unit. The monitoring system is configured to send a first signal to a radio frequency (RF) reader at a frequency based at least in part on the effective capacitance of the capacitor unit via the first antenna. The first signal is associated with health of the capacitor unit.

21 Claims, 3 Drawing Sheets

(56) References Cited

U.S. PATENT DOCUMENTS

| | | | | |
|---|---|---|---|---|
| 2011/0273270 A1* | 11/2011 | Brumer | .............. | A61B 5/04085 340/10.1 |
| 2012/0126949 A1* | 5/2012 | Downie | ............... | G02B 6/3895 340/10.1 |
| 2012/0126950 A1* | 5/2012 | Downie | ............... | G02B 6/3895 340/10.1 |
| 2012/0274452 A1* | 11/2012 | Chamarti | ............... | H04Q 1/138 340/10.5 |
| 2013/0314094 A1* | 11/2013 | Farmer | .................. | G01N 25/20 324/430 |

OTHER PUBLICATIONS

Perera-Lluna, Alexandre, et al.; "Automatic capacitor bank identification in power distribution systems", Electric Sower Systems Research, vol. 111, pp. 96-102, Jun. 2014.

\* cited by examiner

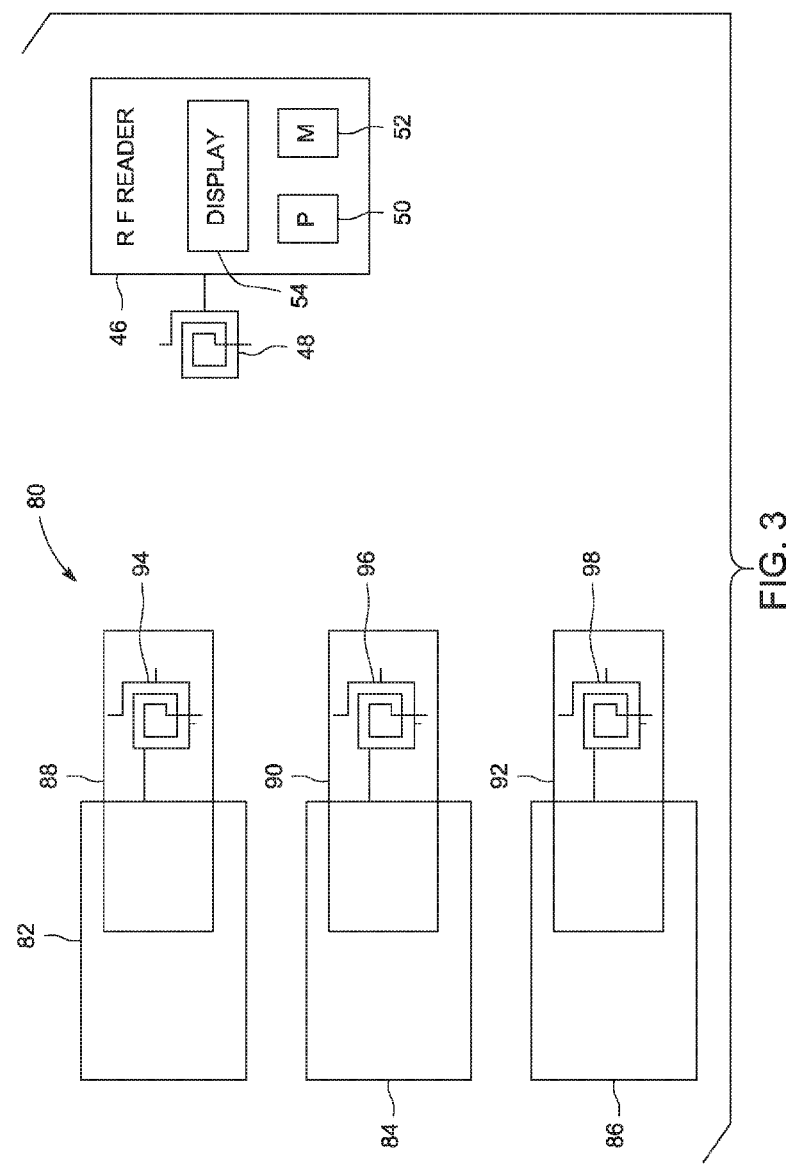

SYSTEMS AND METHODS FOR MONITORING CAPACITOR BANKS

BACKGROUND

The subject matter disclosed herein relates to capacitor monitoring, and more particularly, to monitoring health of capacitors in a capacitor bank.

Capacitor banks may be used for a variety of purposes in power systems, such as regulating reactive power, electric vehicle charging, and the like. For example, a power grid may include one or more inductive loads, such as appliances, motors, and the like, that cause reactive power. The reactive power may reduce the quality of power delivered to the loads on the power grid. As such, capacitor banks may regulate the reactive power, thereby improving the quality of power provided to the loads.

The capacitor bank may wear over time due to various factors, such as deterioration, overheating, and aging, among others. The wear to the capacitor bank may change the value of capacitance, and thereby reduce the quality of power provided to the loads or cause unplanned outages. Accordingly, improved systems and techniques for monitoring capacitor banks are desirable.

BRIEF DESCRIPTION

Certain embodiments commensurate in scope with the originally claimed disclosure are summarized below. These embodiments are not intended to limit the scope of the claimed disclosure, but rather these embodiments are intended only to provide a brief summary of possible forms of the disclosure. Indeed, embodiments may encompass a variety of forms that may be similar to or different from the embodiments set forth below.

In a first embodiment, a system includes a capacitor unit having one or more capacitors within a body of the capacitor unit, wherein the capacitor unit comprises at least two bushings, and a monitoring system having a first antenna, wherein the monitoring system is configured to couple to the at least two bushings to form a resonant frequency (LC) circuit having a capacitance based at least in part on an effective capacitance of the capacitor unit, wherein the monitoring system is configured to send a first signal to a radio frequency (RF) reader at a frequency based at least in part on the effective capacitance of the capacitor unit via the first antenna, wherein the first signal is associated with health of the capacitor unit.

In a second embodiment, a method includes sending, via a processor of a radio frequency (RF) reader, a first signal to close a switch of a monitoring system for a capacitor unit, wherein the monitoring system is configured to form a resonant frequency circuit (LC circuit) having a first inductance based at least in part on second inductance of an antenna and an effective capacitance of the capacitor unit, and receiving, via the processor, a second signal from the monitoring system, wherein the second signal comprises a first frequency based at least in part on the effective capacitance of the capacitor unit.

In a third embodiment, a system for monitoring capacitor units of a capacitor bank includes a first capacitor unit of the capacitor bank having a first set of capacitors within a first body of the first capacitor unit, a second capacitor unit of the capacitor bank having a second set of capacitors within a second body of the second capacitor unit, a first monitoring system having a first antenna, wherein the first monitoring system is configured to couple to the first capacitor unit to form a first resonant frequency (LC) circuit having a first capacitance based at least in part on an effective capacitance of the first capacitor unit, wherein the first monitoring system is configured to send a first signal at a first frequency based at least in part on the effective capacitance of the first capacitor unit via the first antenna, wherein the first signal is associated with a first health of the first capacitor unit, a second monitoring system having a second antenna, wherein the second monitoring system is configured to couple to the second capacitor unit to form a second resonant frequency (LC) circuit having a second capacitance based at least in part on an effective capacitance of the second capacitor unit, wherein the second antenna is configured to send a second signal at a second frequency based at least in part on the effective capacitance of the second capacitor unit via the second antenna, wherein the second signal is associated with a second health of the second capacitor unit, and a radio frequency (RF) reader configured to receive the first signal to determine the first health of the first capacitor unit based on the first frequency and to receive the second signal to determine the second health of the second capacitor unit based on the second frequency.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 3 shows a block diagram illustrating the RF reader communicating with a set of monitoring systems of FIG. 1, in accordance with an embodiment.

DETAILED DESCRIPTION

The subject matter disclosed herein relates to monitoring a capacitor unit of a capacitor bank. A capacitor bank may be electrically coupled to a power grid to regulate reactive power on the power grid. The capacitor bank may include one or more capacitor units, and each of the one or more capacitor units may include one or more individual capacitors. For a number of reasons, the capacitor bank may not provide the desired capacitance to the power grid. For example, one or more capacitor units may have a reduced capacitance due to deterioration, short circuits, physical damage, exceeding designed limitations, or the like, thereby causing the capacitor bank to have a reduced capacitance. In the event of reduced capacitance provided by the capacitor bank, the reliability of the power grid may be reduced. In conventional systems, the operator may halt the system, take the capacitor unit off-line (e.g., disconnect from operation), and test each of the capacitor units to identify the capacitor unit having reduced capacitance. The process of removing and testing the capacitor units may be time consuming and result in increased downtime of a power system.

With the foregoing in mind, in certain embodiments, a monitoring system may monitor the capacitor units of the capacitor bank while the capacitor units are on-line (e.g., in operation on the power grid) to improve reliability of the power grid and/or to reduce downtime of the capacitor bank.

The monitoring system may include an antenna that couples to the capacitor unit to form a resonant frequency (LC) circuit in which a capacitance of the LC circuit is based at least in part on a capacitance of the capacitor unit. The LC circuit may provide a signal to a reader using near field communication. In some embodiments, the signal may be "passively" communicated to a reader. That is, the LC circuit may send the signal to the reader without a battery and/or without power. The reader may receive the signal and determine health of the capacitor units 12 based on a frequency of the signal. As such, the operators may assess the health of the capacitor unit 12 while the capacitor unit 12 is operating on-line.

Figure 1:
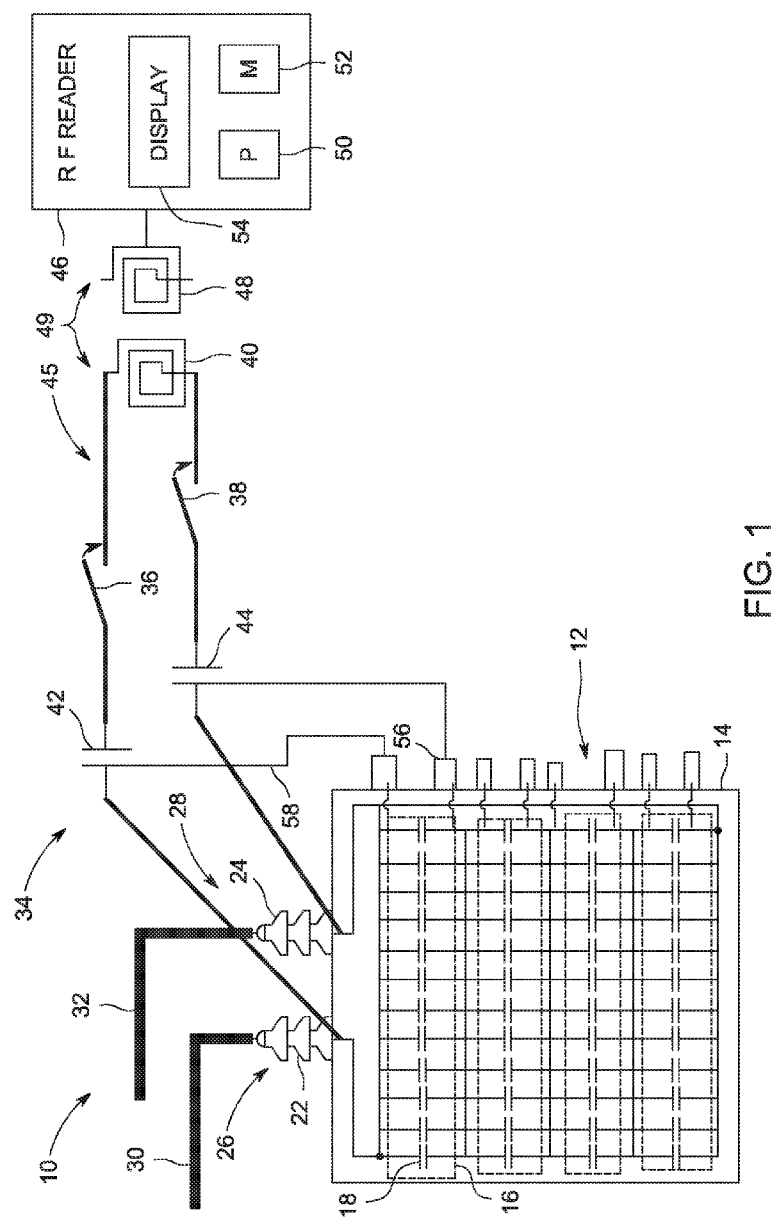
FIG. 1 shows a schematic diagram of a monitoring system for a capacitor unit of a capacitor bank, in accordance with an embodiment.

By way of introduction, FIG. 1 shows a diagram of a system 10 that includes a capacitor unit 12 of a capacitor bank (not shown) to regulate the reactive power on the system 10. The capacitor unit 12 may include a body 14 that encloses one or more sections 16 that have one or more capacitors 18 in each section 16. The one or more capacitors 18 may be coupled in series, in parallel, or in any suitable combination to provide capacitance to the system 10.

In some embodiments, the body 14 may include a first bushing 22 and a second bushing 24 to protect a first terminal 26 and a second terminal 28 of the capacitor unit 12, respectively. The capacitor unit 12 may be coupled to another capacitor unit 12 in series, in parallel, or in a combination thereof in the capacitor bank, or the capacitor unit 12 may be coupled to the power grid through the lines 30 and 32.

Additionally, the capacitor unit 12 may be coupled to a monitoring system 34. The monitoring system 34 may monitor the health of the capacitor unit 12 based on a characteristic (e.g., capacitance) of the capacitor unit 12. In one embodiment, the monitoring system 34 may be coupled to the capacitor unit 12 via the first terminal 26 and the second terminal 28 that monitors health of the capacitor unit 12.

In the illustrated embodiment, the monitoring system 34 includes a first switch 36 and a second switch 38. In an embodiment, the first switch and/or the second switch may be radio frequency (RF) actuated switches that open and/or close based on RF signals from an RF reader. Further, the monitoring system 34 includes a first antenna 40 between the first switch 36 and the second switch 38. Additionally, the monitoring system 34 may include a first decoupling capacitor 42 between the first terminal 26 and the first switch 36 and a second decoupling capacitor 44 between the second terminal 28 and the second switch 38 to prevent an increase or decrease in voltage from affecting the monitoring system 34. While two switches and two decoupling capacitors are shown in FIG. 1, this is meant as an example, and any suitable number of switches and/or decoupling capacitors suitable may be used.

When the first switch 36 and the second switch 38 are closed, the monitoring system 34 forms a resonant frequency (LC) circuit 45 with an inductance of the first antenna 40 and a capacitance of the capacitor unit 12, as well as the capacitance of the decoupling capacitors 42 and 44. The first antenna 40 may include a coil with an inductance based on a number of turns of the coil (e.g., the more turns the more inductance). The first antenna may be any suitable type of antenna, such as a patch antenna, a dipole antenna, or the like. The first antenna 40 and the capacitors 18 within the capacitor unit 12 form the LC circuit 45. As such, the LC circuit 45 depends on the capacitance of the capacitor unit 12.

An RF reader 46 may include a second antenna 48 to communicate via near field communication (e.g., within a half, one, or two wavelengths of the signal) with the first antenna 40 of the monitoring system 34, while the RF reader 46 is within some proximity (e.g., within a half, one, or two wavelengths, or within 2 cm, 4 cm, 10 cm, 1 meter, or 10 meters) of the first antenna 40. For example, the RF reader 46 and the LC circuit 45 may establish an inductive mutual coupling 49 between each other such that the current through the second antenna 48 is induced from a current through the monitoring system 34.

While the second antenna 48 of the RF reader 46 is within near field communication proximity of the first antenna 40, the RF reader 46 may perform a scan of the capacitor unit 12 in which the RF reader 46 sends one or more signals to cause the first switch 36 and the second switch 38 to close. While the first switch 36 and the second switch 38 are closed, the first antenna 40 may send one or more signals to the second antenna 48 by inducing a voltage and/or current through the second antenna 48 at a frequency based on the inductance and the capacitance of the LC circuit 45. For example, the resonant frequency of the LC circuit 45 may be:

$$f = \frac{1}{2\pi\sqrt{LC}} \quad (1)$$

where the L is the inductance of the first antenna 40 and the C is the effective capacitance of the capacitor unit 12 and the antenna (e.g., including the decoupling capacitors 42 and 44). Because the resonant frequency of the LC circuit 45 depends on capacitance of the capacitor unit 12, the resonant frequency may indicate health (e.g., changes in capacitance) of the capacitor unit 12. That is, an increase in the frequency of the LC circuit 45 may correspond to a decrease in the capacitance provided by the capacitor unit 12. Conversely, a decrease in the frequency of the LC circuit 45 may correspond to an increase in the capacitance provided by the capacitor unit 12. A change in the frequency that exceeds a certain amount or threshold may indicate that the capacitor unit 12 may be in an unhealthy state (e.g., reduced performance of one or more capacitors 18 of the capacitor unit 12).

The RF reader 46 may include a processor 50 and a memory 52. While a single processor 50 will be used throughout this disclosure, as one of ordinary skill in the art will appreciate, multiple processors may be used by the RF reader 46. The processor 50 may be operatively coupled to the memory 52 to execute instructions for carrying out the presently disclosed techniques. These instructions may be encoded in programs or code stored in a tangible non-transitory computer-readable medium, such as the memory 52 and/or other storage. The processor 50 may be a general purpose processor, system-on-chip (SoC) device, application-specific integrated circuit, or some other processor configuration. The memory 52, in the embodiment, includes a computer readable medium, such as, without limitation, a hard disk drive, a solid state drive, a diskette, a flash drive, a compact disc, a digital video disc, random access memory (RAM), read-only memory (ROM), electrically erasable programmable read-only memory (EEPROM), and/or any suitable storage device that enables the processor 50 to store, retrieve, and/or execute instructions and/or data.

In some embodiments, the RF reader 46 may perform an RF sweep in which radio frequency bands are scanned to detect signals being transmitted. Further, the RF reader 46 may include a tunable receiving frequency to sweep the desired frequency band. The processor 50 may receive the one or more signals from the induced voltage and/or current through the second antenna 48 at a frequency that corresponds to the frequency of voltage and/or current in the LC circuit 45 (e.g., based at least in part on the capacitance of the capacitor unit 12). The processor 50 may then determine the health of the capacitor unit 12 based on the frequency of the voltage and/or current. In one example, the RF reader 46 may first be calibrated with an initial scan (e.g., during installation of the capacitor unit 12). During the initial scan, the processor 50 may receive a calibration signal having a frequency that corresponds to the frequency of the voltage and/or current from the inductance and capacitance of the LC circuit 45. For example, the calibration signal may have a first frequency indicative of the capacitance value of the capacitance unit 12 at a first time. After calibrating the RF reader 46, the processor 50 may perform a scan of the capacitor unit 12 to determine the health of the capacitor unit 12 by comparing a second frequency of the voltage and/or current due to the LC circuit 45 at a second time with the first frequency of the voltage and/or current of the initial scan. Further, the processor 50 may compare the second frequency of the voltage and/or current due to the LC circuit 45 with one or more threshold frequencies determined based on the initial scan. For example, the processor 50 may determine a threshold frequency based on a tolerance (e.g., 10%, 20%, 50%) from the first frequency. The processor 50 may then compare the second frequency to the threshold frequency (e.g., 10% from the first frequency). If the second frequency exceeds the threshold frequency, the processor 50 may indicate that the capacitor unit 12 is in an unhealthy state. In certain embodiments, the RF reader 46 may display the frequency to an operator on a display 54 of the RF reader 46, thereby enabling health of the capacitor unit 12 to be viewed by an operator. By communicating wirelessly with the RF reader 46, the monitoring system 34 may provide the one or more signals to the RF reader 46 while the capacitor unit 12 is on-line (e.g., in operation on the power grid), thereby reducing a frequency of disconnecting the capacitor unit 12 for testing.

In some embodiments, the capacitor unit 12 may include bushings 56 coupled to each of the sections 16 to monitor each of the sections 16 of capacitors 18 in the capacitor unit 12. Each of the sections 16 may be coupled to an individual bushing 56. Each of the bushings 56 may be coupled to the monitoring system 34 via the electrical wiring 58. In certain embodiments, each of the wires 58 may include RF controlled switches to couple and decouple the respective section 16 of capacitors 18, as described above with the first switch 36 and the second switch 38. As such, the RF reader 46 may selectively scan each of the respective sections 16 to determine a health of the capacitors 18 of the selected section 16. Although the bushings 56 of the sections 16 are shown as being coupled in a particular manner in FIG. 1, the monitoring system 34 may be coupled to the sections 16 in any suitable manner. In certain embodiments, each of the sections 16 may be coupled (e.g., in parallel) to the first terminal 26 and the second terminals 28. Further, RF controlled switches between each of the sections 16 and the first terminal 26 and the second terminal 28 may enable the RF reader 46 to selectively scan each of the respective sections 16. In certain embodiments, the RF reader 46 may send (e.g., via the antenna 48 or another antenna) signal(s) wirelessly to a monitoring center to enable an operator in the monitoring center to assess the health of the capacitor unit. For example, the RF reader 46 may send the frequency provided to the RF reader 46 and/or a health status determined by the RF reader 46.

Figure 2:
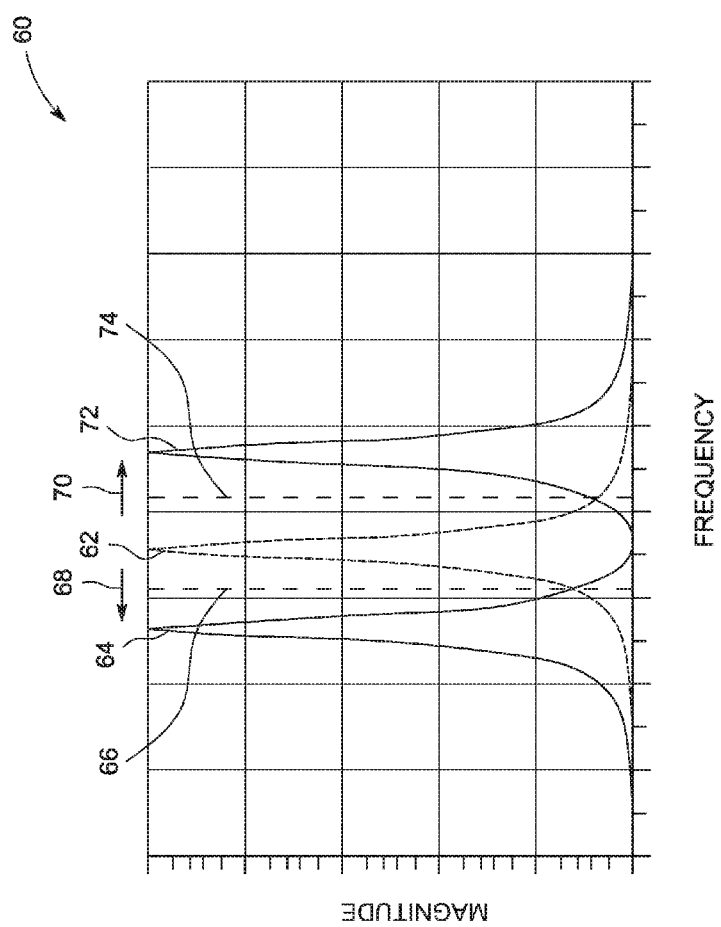
FIG. 2 shows a graph of signals received by a radio frequency (RF) reader of the monitoring system of FIG. 1, in accordance with an embodiment.

FIG. 2 shows a graph 60 of the magnitudes of frequencies received by the RF reader 46 of FIG. 1. As mentioned above, the RF reader 46 may be calibrated with an initial scan during the installation process. While the capacitor unit 12 is in a healthy state, the monitoring system 34 may send a signal to the RF reader 46 at a first resonant frequency 62. The RF reader 46 may determine the capacitance based on the detected frequency according to equation (1) above. The RF reader 46 may then perform another scan (e.g., by sending a signal that causes the first switch 36 and the second switch 38 to close). The monitoring system 34 may then send a signal to the RF reader 46 at a second resonant frequency 64. In some embodiments, the RF reader 46 may determine a health status (e.g., healthy, unhealthy, or replacement status) by comparing the second resonant frequency 64 to a first threshold 66 based on whether the second resonant frequency 64 is within a tolerance (e.g., 10%, 20%, 50%, etc.) from the first resonant frequency 62. From equation (1) above, a decrease (as indicated by arrow 68) from the first resonant frequency 62 to the second resonant frequency 64 may be associated with an increase in the capacitance of the capacitor unit 12.

Similarly, an increase (as indicated by arrow 70) from the first resonant frequency 62 to a third resonant frequency 72 greater than the first resonant frequency 62 may be associated with a decrease in capacitance of the capacitor unit 12. In some embodiments, the RF reader 46 may determine the health status (e.g., healthy, unhealthy, or replacement status) by comparing the third resonant frequency 72 to a second threshold 74 determined based on a tolerance (10%, 20%, 50%, etc.) from the first resonant frequency 62. The RF reader 46 may display data indicative of the health of the capacitor unit 12 on the display 54, such as the resonant frequency, the capacitance, or a health status (e.g., based on comparing the frequency to one or more thresholds). Further, the RF reader 46 may be used to read more than one capacitor unit 12.

FIG. 3 shows the RF reader 46 within proximity of near field communication of a capacitor bank 80 having capacitor units 82, 84, and 86. While three capacitor units are shown in FIG. 3, the capacitor bank 80 may include any suitable number of capacitor units. Each of the capacitor units 82, 84, and 86 may have a respective monitoring system 88, 90, and 92, similar to the monitoring system 34 described with respect to FIG. 1. The monitoring system 88 may have a first inductance based on a first antenna 94 having a first number of turns. The monitoring system 90 may have a second inductance based on a second antenna 96 having a second number of turns, different from the first number of turns. The monitoring system 92 may have a third inductance based on a third antenna 98 having a third number of turns, different from the first number and second number of turns.

The RF reader 46 may identify which signal is coming from which capacitor unit 82, 84, and 86 based on frequencies generated by each monitoring system 88, 90, and 92 having a different inductance (e.g., from a different number of turns). The inductance between the first antenna 94, second antenna 96, and third antenna 98 may have a difference in inductance great enough to receive variations in frequencies. For example, the processor 50 may identify that the first capacitor unit 82 is associated with the first signal based at least in part on a first frequency caused at least in part by the first number of turns of the first antenna 94. Further, the processor 50 may identify that the second capacitor unit 84 is associated with the second signal based at least in part on the second frequency caused at least in part by the second number of turns of the second antenna 96. In certain embodiments, the RF reader 46 may identify each signal is coming from the respective capacitor unit 82, 84, and 86 based on a geometrical size of the antenna, a different configuration of the antenna, or the like. In this manner, the frequency responses from each of the capacitor units 82, 84, and 86 may not overlap each other. As such, the RF reader 46 may differentiate signals from multiple capacitor units 82, 84, and 86 to identify the health of multiple capacitors 18. Further, the RF reader 46 may compare each of the first frequency and the second frequency to a first threshold frequency and a second threshold frequency, respectively. The RF reader 46 may then display a health status of each capacitor unit 82, 84, and 86 on the display 54 of the RF reader 46 based on the respective comparisons.

Technical effects of the disclosure include communicating health of a capacitor unit. In certain embodiments, a monitoring system may send a first signal to an RF reader having a frequency based at least in part on the capacitance of the capacitor unit. The RF reader may determine the health of the capacitor unit by comparing the frequency of the signal to a threshold frequency. The RF reader may then display the health of the capacitor unit to an operator on a display of the RF reader. In certain embodiments, the RF reader may send a second signal to close RF actuated switches of the monitoring system to cause the monitoring system to send the first signal having the frequency. Further, in some embodiments, the RF reader may be used to monitor health of more than one capacitor unit based on a number of turns of an antenna, a geometrical size of the antenna, a different configuration of the antenna, or the like, of each respective monitoring system.

This written description uses examples to disclose embodiments of the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system, comprising:
  a capacitor unit having one or more capacitors within a body of the capacitor unit, wherein the capacitor unit comprises at least two bushings; and
  a monitoring system having a first antenna, wherein the monitoring system is configured to couple to the at least two bushings to form a resonant frequency (LC) circuit having a capacitance based at least in part on an effective capacitance of the capacitor unit, wherein the monitoring system is configured to send a first signal to a radio frequency (RF) reader at a frequency based at least in part on the effective capacitance of the capacitor unit via the first antenna, wherein the first signal is associated with health of the capacitor unit.

2. The system of claim 1, comprising the RF reader configured to receive the first signal and to determine health of the capacitor unit based at least in part on the frequency.

3. The system of claim 2, wherein the RF reader is configured to send a second signal to close at least one switch coupled between at least two bushings and the first antenna.

4. The system of claim 2, wherein the RF reader is configured to display the health of the capacitor unit on a display of the RF reader.

5. The system of claim 2, wherein the RF reader is configured to send a third signal to a monitoring center via wireless communication.

6. The system of claim 2, wherein the RF reader is configured to compare the frequency to a threshold frequency to determine the health of the capacitor unit.

7. The system of claim 2, wherein the RF reader comprises a second antenna configured to communicatively couple to the first antenna via near field communication.

8. The system of claim 1, wherein the monitoring system comprises at least one decoupling capacitor between the first antenna and the capacitor unit.

9. The system of claim 1, wherein the RF reader is configured to determine the capacitance based at least in part on the effective capacitance of the capacitor unit and the equation $$f = \frac{1}{2\pi\sqrt{LC}}$$

where L is based at least in part on inductance of the first antenna, C is the effective capacitance of the capacitor unit, and f is the frequency of the first signal.

10. The system of claim 1, wherein the monitoring system is configured to selectively couple to a pair of bushings associated with a portion of capacitors of the capacitor unit to enable the monitoring system assess the health of the portion of the capacitors.

11. The method of claim 10, comprising receiving the first frequency while the capacitor unit is in operation on a power grid.

12. A method, comprising:
  sending, via a processor of a radio frequency (RF) reader, a first signal to close a switch of a monitoring system for a capacitor unit, wherein the monitoring system is configured to form a resonant frequency circuit (LC) having a first inductance based at least in part on second inductance of an antenna and an effective capacitance of the capacitor unit; and
  receiving, via the processor, a second signal from the monitoring system, wherein the second signal comprises a first frequency based at least in part on the effective capacitance of the capacitor unit.

13. The method of claim 12, comprising:
  determining, via the processor, a health of the capacitor unit based at least in part on the first frequency; and
  displaying, via the processor, the health of the capacitor unit on a display.

14. The method of claim 12, comprising displaying, via the processor, the first frequency on a display of the RF reader.

15. The method of claim 12, comprising receiving the second signal while the RF reader is positioned within near field communication range of the antenna.

16. The method of claim 12, comprising:
  receiving, via the processor, a third signal having a second frequency to calibrate health of the capacitor unit at the RF reader;

determining, via the processor, a threshold frequency based on the second frequency associated with reduced performance of the capacitor unit based on a tolerance;

comparing, via the processor, the first frequency to the threshold frequency to determine health of the capacitor unit; and displaying, via the processor, the health of the capacitor unit on a display to be displayed to an operator to enable the operator to maintain the capacitor unit while the capacitor unit is in operation.

17. A system for monitoring capacitor units of a capacitor bank, comprising:

a first capacitor unit of the capacitor bank having a first set of capacitors within a first body of the first capacitor unit;

a second capacitor unit of the capacitor bank having a second set of capacitors within a second body of the second capacitor unit;

a first monitoring system having a first antenna, wherein the first monitoring system is configured to couple to the first capacitor unit to form a first resonant frequency (LC) circuit having a first capacitance based at least in part on an effective capacitance of the first capacitor unit, wherein the first monitoring system is configured to send a first signal at a first frequency based at least in part on the effective capacitance of the first capacitor unit via the first antenna, wherein the first signal is associated with a first health of the first capacitor unit;

a second monitoring system having a second antenna, wherein the second monitoring system is configured to couple to the second capacitor unit to form a second resonant frequency (LC) circuit having a second capacitance based at least in part on an effective capacitance of the second capacitor unit, wherein the second antenna is configured to send a second signal at a second frequency based at least in part on the effective capacitance of the second capacitor unit via the second antenna, wherein the second signal is associated with a second health of the second capacitor unit; and a radio frequency (RF) reader configured to receive the first signal to determine the first health of the first capacitor unit based on the first frequency and to receive the second signal to determine the second health of the second capacitor unit based on the second frequency.

18. The system of claim 17, wherein the first antenna has a first number of turns and the second antenna has a second number of turns different from the first number of turns, and wherein the RF reader is configured to identify that the first capacitor unit is associated with the first signal based at least in part on the first frequency caused at least in part by the first number of turns.

19. The system of claim 17, wherein the RF reader is configured to send a third signal to the first monitoring system to close at least one switch of the first monitoring system.

20. The system of claim 17, wherein the RF reader is configured to compare each of the first frequency and the second frequency to a first threshold frequency and a second threshold frequency, respectively.

21. The system of claim 17, wherein the RF reader is configured to display a first health status of the first capacitor unit and second health status of the second capacitor unit on a display of the RF reader.

* * * * *